(12) United States Patent
Max

(10) Patent No.: US 7,919,968 B2
(45) Date of Patent: Apr. 5, 2011

(54) SYSTEM AND METHOD FOR DISTORTION ANALYSIS

(75) Inventor: Solomon Max, New York, NY (US)

(73) Assignee: LTX Corporation, Norwood, MA (US)

( * ) Notice: Subject to any disclaimer, the term of this patent is extended or adjusted under 35 U.S.C. 154(b) by 126 days.

(21) Appl. No.: 11/774,774

(22) Filed: Jul. 9, 2007

(65) Prior Publication Data

US 2009/0015267 A1    Jan. 15, 2009

(51) Int. Cl.
*G01R 23/20*    (2006.01)

(52) U.S. Cl. ......... 324/620; 330/149; 455/501; 375/278

(58) Field of Classification Search .................. 324/620
See application file for complete search history.

(56) References Cited

U.S. PATENT DOCUMENTS

| | | | | | |
|---|---|---|---|---|---|
| 3,810,018 | A | * | 5/1974 | Stover | 455/42 |
| 4,968,968 | A | * | 11/1990 | Taylor | 342/174 |
| 5,125,100 | A | * | 6/1992 | Katznelson | 725/143 |
| 6,172,564 | B1 | * | 1/2001 | Rzyski | 330/149 |
| 2004/0041628 | A1 | * | 3/2004 | Okubo et al. | 330/149 |
| 2005/0004467 | A1 | * | 1/2005 | Shiina et al. | 600/449 |
| 2005/0207334 | A1 | * | 9/2005 | Hadad | 370/203 |
| 2006/0088125 | A1 | * | 4/2006 | Miyatani et al. | 375/296 |

* cited by examiner

*Primary Examiner* — Timothy J Dole
*Assistant Examiner* — Benjamin M Baldridge
(74) *Attorney, Agent, or Firm* — Holland & Knight LLP; Brian J. Colandreo, Esq.; Mark H Whittenberger, Esq.

(57) ABSTRACT

A method, circuit and system for determining at least one of an amplitude and a relative phase of a signal under test. A reference signal is generated based, at least in part, upon the at least one of the amplitude and the relative phase of the signal under test. The reference signal is combined with the signal under test to generate a residual signal indicative of a distortion within the signal under test. The residual signal is measured.

15 Claims, 4 Drawing Sheets

SYSTEM AND METHOD FOR DISTORTION ANALYSIS

TECHNICAL FIELD

This disclosure relates to analyzing distortion and noise in a test signal and, more particularly, to analyzing distortion and noise of a sinusoidal wave signal.

BACKGROUND

Three primary methods have conventionally been used for measuring the distortion imparted by a system under test or components of a system under test. The system under test is typically driven by a test signal and provides an output signal. According to one technique, the output signal may be passed through a notch filter, which may reject the fundamental frequency of the output signal. The harmonics and noise of the remaining residual signal may be measured. However, not only may the use of a notch filter remove parts of the noise in the output signal, but a separate notch filter must be constructed for every frequency that needs to be analyzed.

A second technique uses a phase-locked loop to generate a signal at the fundamental frequency of the output signal. The noise in the output signal may be evaluated based on the differences between the output signal and the signal generated by the phase-locked loop. Unfortunately, using a phase-locked loop to search for the fundamental frequency of the output signal may require a great deal of time. Furthermore, the constraints on the distortion of the phase-locked loop generated signal may be very aggressive when the output signal being examined has low distortion.

A third technique for analyzing the distortion in an output signal may involve the use of a spectrum analyzer, which may measure the individual frequency components of the output signal. For an output signal having low distortion, the spectrum analyzer itself must have very low distortion. The residual noise and distortion of the spectrum analyzer may be too great for analyzing a low distortion output signal. Additionally, measuring the individual frequency components of an output signal using a spectrum analyzer may be a slow process.

SUMMARY OF THE DISCLOSURE

In a first implementation, a method of analyzing distortion includes determining at least one of an amplitude and a relative phase of a signal under test. A reference signal is generated based, at least in part, upon the at least one of the amplitude and the relative phase of the signal under test. The reference signal is combined with the signal under test to generate a residual signal indicative of a distortion within the signal under test. The residual signal is measured.

One or more of the following features may be included. The signal under test may be an analog signal under test. Determining at least one of the amplitude and the relative phase of the signal under test may include providing the analog signal under test to an analog-to-digital converter to generate a digital signal under test. The reference signal may be an analog reference signal. Generating the reference signal may include receiving the digital signal under test. A digital reference signal may be generated based, at least in part, upon the digital signal under test. The digital reference signal may be provided to a digital-to-analog converter to generate the analog reference signal.

The reference signal may be essentially out of phase with the signal under test. Combining the reference signal with the signal under test may include adding the reference signal and the signal under test.

The reference signal may be essentially in phase with the signal under test. Combining the reference signal with the signal under test may include subtracting the reference signal from the signal under test.

Measuring the residual signal may include providing the residual signal to an analog-to-digital converter. Providing the residual signal to an analog-to-digital converter may include amplifying the residual signal.

In another implementation, a distortion analysis circuit includes a sampling circuit configured to determine at least one of an amplitude and a relative phase of a signal under test. A signal generator circuit is configured to provide a reference signal based, at least in part, upon the at least one of the amplitude and the relative phase of the signal under test. A combining circuit is configured to combine the reference signal with the signal under test to generate a residual signal indicative of a distortion within the signal under test.

One or more of the following features may be included. The sampling circuit may include an analog-to-digital converter configured to generate a digital signal under test. The reference signal may be an analog reference signal and the signal generator circuit may include a digital-to-analog converter. The signal generator circuit may be configured to receive the digital signal under test. A digital reference signal may be generated based, at least in part, upon the digital signal under test. The digital reference signal may be provided to the digital-to-analog converter to generate the analog reference signal.

The reference signal may be essentially out of phase with the signal under test and the combining circuit may be configured to add the signal under test and the reference signal. The reference signal may be essentially in phase with the signal under test and the combining circuit may be configured to subtract the reference signal from the signal under test.

The distortion analysis circuit may include an amplifier circuit configured to amplify the residual signal. The residual signal may be an analog residual signal. The distortion analysis circuit may include an analog-to-digital converter configured to process the analog residual signal and generate a digital residual signal.

In another implementation, an automatic test system includes an input port configured to receive a signal under test from a circuit to be analyzed. A distortion analysis circuit includes a sampling circuit configured to receive the signal under test and determine at least one of an amplitude and a relative phase of the signal under test. A signal generator circuit is configured to provide a reference signal based, at least in part, upon the at least one of the amplitude and the relative phase of the signal under test. A combining circuit is configured to combine the reference signal with the signal under test to generate a residual signal indicative of a distortion within the signal under test.

One or more of the following features may be included. The sampling circuit may include an analog-to-digital converter configured to generate a digital signal under test. The reference signal may be an analog reference signal and the signal generator circuit may include a digital-to-analog converter. The signal generator circuit may be configured to receive the digital signal under test. A digital reference signal may be generated based, at least in part, upon the digital signal under test. The digital reference signal may be provided to the digital-to-analog converter to generate the analog reference signal.

The reference signal may be essentially out of phase with the signal under test and the combining circuit may be configured to add the signal under test and the reference signal. The reference signal may be essentially in phase with the signal under test and the combining circuit may be configured to subtract the reference signal from the signal under test.

The automatic test system may include an amplifier circuit configured to amplify the residual signal. The residual signal may be an analog residual signal. The distortion analysis circuit may include an analog-to-digital converter configured to process the analog residual signal and generate a digital residual signal.

The measuring circuit may include an analog-to-digital converter configured to measure the residual signal. The test circuit may include an amplifier configured to amplify the residual signal.

The details of one or more implementations are set forth in the accompanying drawings and the description below. Other features and advantages will become apparent from the description, the drawings, and the claims.

DETAILED DESCRIPTION OF THE DISCLOSURE

Figure 1:
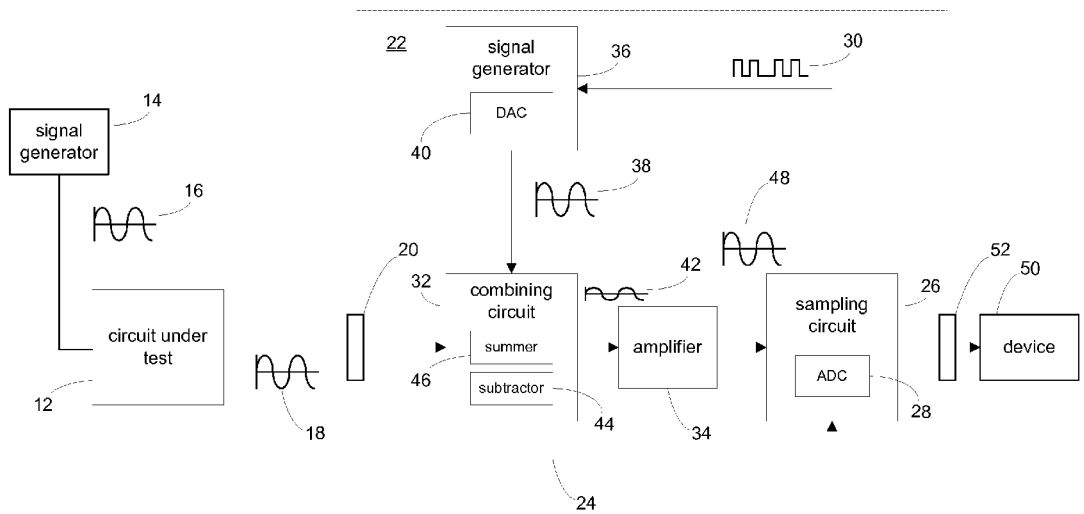
FIG. 1 is a block diagram of a distortion analysis system.

Referring to FIG. 1, there is shown an automatic test system 10 for measuring the distortion imparted by circuit under test 12. Signal generator 14 may apply test signal 16 to circuit under test 12, and the resulting output signal (i.e., signal under test 18) generated by circuit under test 12 may be provided to input port/terminal 20 of automatic test system 10. Since test signal 16 is typically a distortion-free signal, the distortion imparted by circuit under test 12 may be determined by comparing test signal 16 and signal under test 18.

As discussed above, circuit under test 12 may be driven by test signal 16. Examples of test signal 16 may include, but are not limited to, an 8 VAC$_{peak-to-peak}$ 1 kHz sinusoidal signal. The amplitude, frequency, and type of test signal (e.g., test signal 16) applied to circuit under test 12 may vary depending on the type of circuit being tested (e.g., circuit under test 12). For example, for some circuit types, a square wave signal or triangle wave signal may be applied to circuit under test 12.

In response to test signal 16 being applied to circuit under test 12, circuit under test 12 may provide an output signal (i.e., analog signal under test 18), which may have a frequency that corresponds to the frequency of test signal 16. However, the amplitude and phase of analog signal under test 18 may vary with respect to test signal 16 due to various attenuating/phase-shifting components (not shown) included within circuit under test 12. Further, analog signal under test 18 may be distorted (with respect to test signal 16) due to various distortion inducing components included within circuit under test 12.

Automatic test system 10 may include an electrical circuit 22, which may receive (on input port/terminal 22) analog signal under test 18 from circuit under test 12 and may measure the distortion within analog signal under test 18 without requiring access to test signal 16 and without knowing the phase/amplitude of test signal 16.

Figure 2:
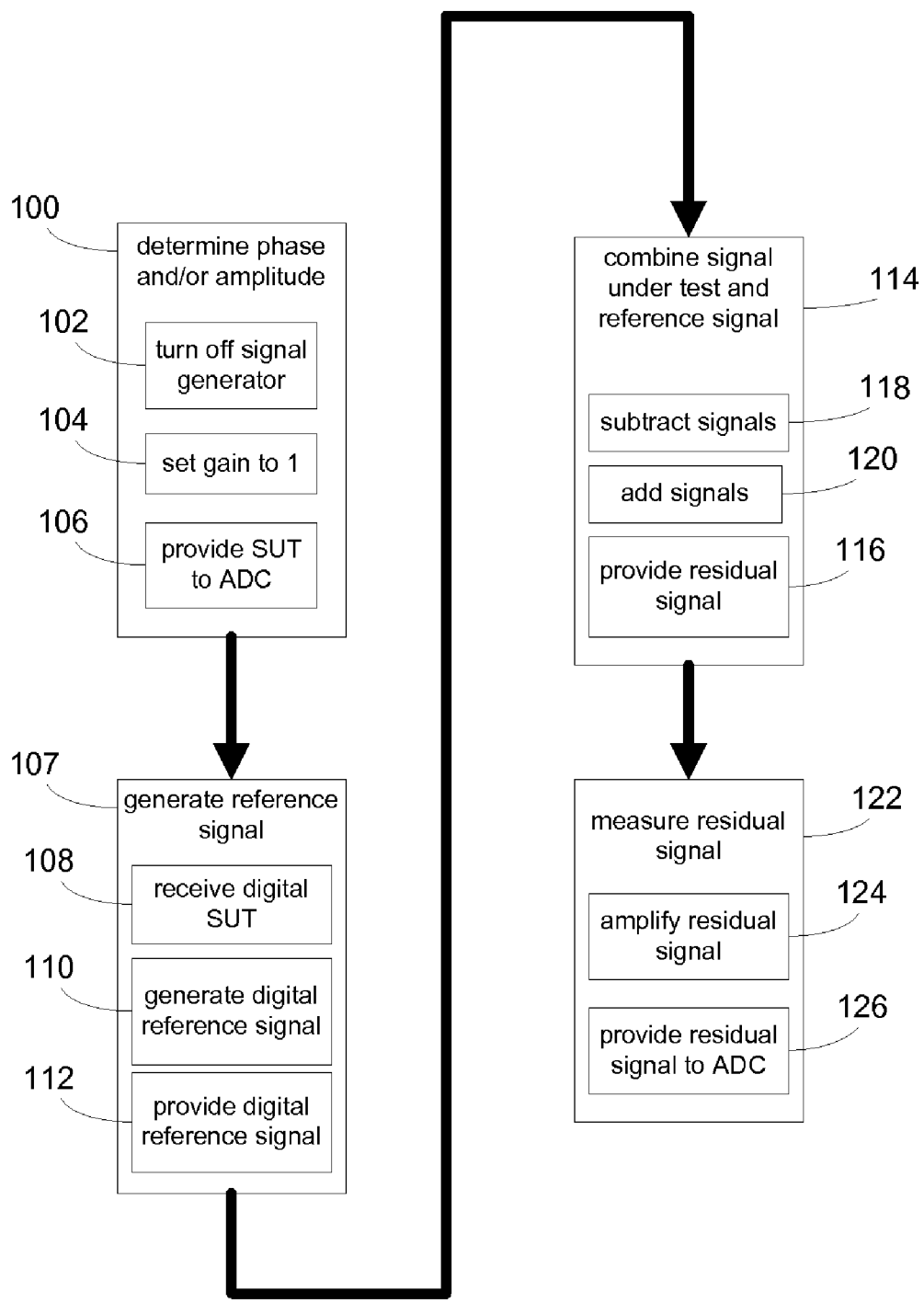
FIG. 2 is a flowchart of a process executed by the distortion analysis system of FIG. 1.

Referring also to FIG. 2, automatic test system 10 may be configured to determine 100 at least one of the relevant phase and/or the amplitude of analog signal under test 18. In order to facilitate such a determination, analog signal under test 18 may be directly provided (via path 24) to sampling circuit 26.

Sampling circuit 26 may include analog-to-digital (ADC) converter 28 and analog signal under test 18 may be provided to analog-to-digital converter 28, which may convert analog signal-under-test 18 to digital signal under test 30. Analog-to-digital converter 28 may be e.g., a 16-bit, analog-to-digital converter operating at approximately a 1 MHz sampling rate. Digital signal under test 30 may be a single bit serial data stream.

When setting the sampling rate and bit-resolution of analog-to-digital converter 28, various criteria may be considered. For example, consideration may be given to the highest anticipated frequency ($f_{max}$) of analog signal under test 18. Once the highest anticipated frequency ($f_{max}$) is determined, this highest anticipated frequency ($f_{max}$) may be doubled to define the Nyquist frequency, and the sampling rate may be set to this doubled frequency ($2f_{max}$) to ensure alias-free signal sampling. Therefore, the sampling rate and bit-resolution of analog-to-digital converter 28 may be configured based upon e.g., the anticipated test signal applied to circuit under test 12. Accordingly, other sampling rates and bit-resolutions are considered to be within the scope of this disclosure.

Input port/terminal 20 of automatic test system 10 may be directly coupled to sampling circuit 26 (via path 24), thus allowing for the direct application of analog signal under test 18 to sampling circuit 26. Alternatively, analog signal under test 18 may be indirectly provided to sampling circuit 26 through combining circuit 32 and amplifying circuit 34. When indirectly providing analog signal under test 18 to sampling circuit 26, automatic test circuit 10 may de-energize (i.e., turn off) 102 signal generator 36 and set 104 the gain of amplifier 34 to one. In such a configuration, analog signal under test 18 may pass through combining circuit 32 and amplifier 34 and be indirectly provided to sampling circuit 26 in an unmodified format.

Upon analog signal under test 18 being provided 106 (either directly or indirectly) to sampling circuit 26, sampling circuit 26 (in conjunction with analog-to-digital converter 28) may generate digital signal under test 30. Digital signal under test 30 may be indicative of the amplitude and relevant phase of analog signal under test 18. Specifically, as digital signal under test 30 is a digital representation of analog signal under test 18, digital signal under test 30 provides information to signal generator 36 concerning the amplitude of analog signal under test 18. In this disclosure, relevant phase is intended to mean the phase of analog signal under test 18 (as received by sampling circuit 26). By providing digital signal under test 30 (which is a digital representation of analog signal under test 18), digital signal under test 30 provides information to signal generator 36 concerning the relevant phase of analog signal under test 18.

When sampling circuit 26 converts analog signal under test 18 to digital signal under test 30, digital signal under test 30 is provided to signal generator 36, thus enabling the generation 107 of analog reference signal 38. Upon receiving digital signal under test 30, signal generator 36 may process digital signal under test 30 to generate 110 a digital reference signal (not shown), which is provided 112 to digital-to-analog (DAC) converter 40. Digital-to-analog converter 40 may generate analog reference signal 36 based upon digital reference signal (not shown).

As discussed above, digital signal under test 30 is a digital representation of analog signal under test 18. When processing digital signal under test 30, signal generator 36 may e.g., smooth digital signal under test 30 to remove all or a portion of the distortion present within signal 30. As discussed above, distortion may be present within digital signal under test 30 due to various distortion inducing components included within circuit under test 12. For example, if digital signal under test 30 is a 1,000 Hz sinusoid that includes considerable distortion in the $\geq$12,000 Hz frequency range, signal generator 36 may process digital signal under test 30 by low-pass-filtering digital signal under test 30 to remove the higher frequency distortion. As discussed above, since digital signal under test 30 contains accurate amplitude and phase information with respect to analog signal under test 18, the digital reference signal (not shown) generated by signal generator 36 may be an "in phase", "correct amplitude", "essentially distortion free" version of digital signal under test 30, and, therefore, analog signal under test 18.

As discussed above, signal generator 36 may include digital-to-analog converter 40. An example of digital-to-analog converter 40 may include, but is not limited to, an AD1955 audio pulse code modulated digital-to-analog converter manufactured by Analog Devices of Norwood, Mass. The digital reference signal (not shown), which is processed by signal generator 36 to remove all or a portion of the distortion of digital signal under test 30, may be provided to digital-to-analog converter 40. Digital-to-analog converter 40 may generate analog reference signal 38 based upon the digital reference signal (not shown).

Figure 3:
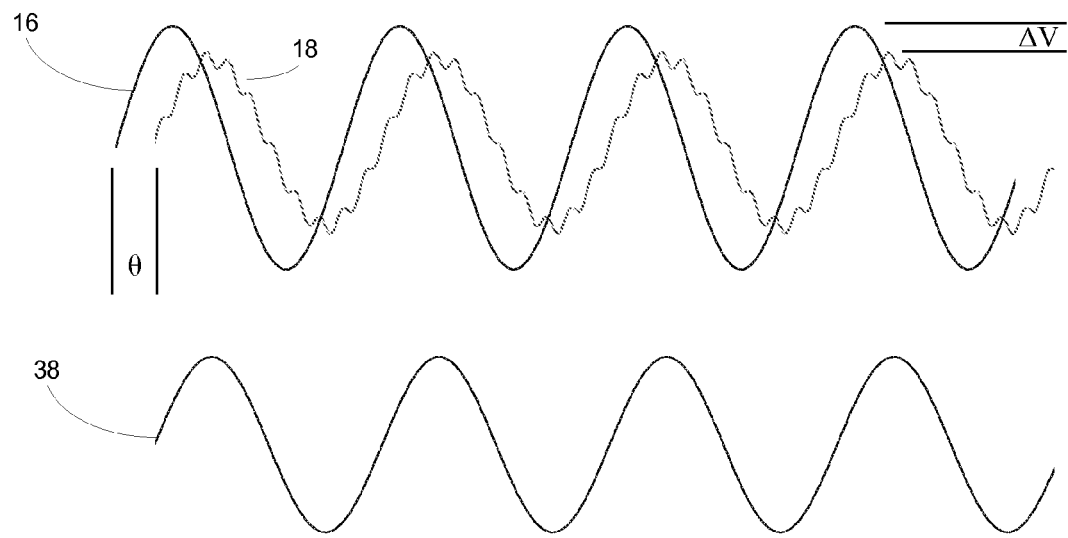
FIGS. 3-4 are diagrammatic representations of an analog signal under test, an "in-phase" analog reference signal, and an analog residual signal.

Referring also to FIG. 3, an exemplary waveform of test signal 16 is shown. As discussed above, test signal 16 may be an essentially distortion-free 8 $VAC_{peak-to-peak}$ 1 kHz sinusoidal signal. Further and as discussed above, analog signal under test 18 may be a distorted version of test signal 16 due to various distortion inducing components included within circuit under test 12. Due to various attenuating/phase-shifting components (not shown) included within circuit under test 12, the amplitude of analog signal under test 18 may be reduced by "$\Delta V$" and the phase of analog signal under test 18 may be shifted by "$\theta$" when compared to test signal 16. As discussed above, digital signal under test 30 is a digital representation of analog signal under test 18; and when processing digital signal under test 30 to produce the digital reference signal (not shown), signal generator 36 may smooth digital signal under test 30 to remove all or a portion of the distortion present within signal under test 30. Digital-to-analog converter 40 may then generate analog reference signal 38 based upon the digital reference signal (not shown). As shown in FIG. 3, analog reference signal 38 may be an essentially distortion-free version of signal under test 18 having essentially the same frequency and amplitude.

As discussed above, an example of digital-to-analog converter 40 may include, but is not limited to, an AD1955 audio pulse code modulated digital-to-analog converter manufactured by Analog Devices of Norwood, Mass., such as may be used in connection with digital music devices e.g., CD players and MP3 players. As is known in the art, pulse code modulated digital-to-analog converters are typically capable of producing a very accurate sinusoidal (or other analog) output in response to a corresponding serial data stream (e.g., the digital reference signal; not shown). Additionally, the output range of digital-to-analog converter 40 may extend beyond the audible range, e.g., to 200 kHz or greater, thereby expanding the available range of frequencies that may be used in connection with automatic test system 10.

Continuing with the above-stated example, signal under test 18 and analog reference signal 38 may be essentially in phase with one another. Combining circuit 32 may combine 114 analog signal under test 18 and analog reference signal 38 to provide 116 analog residual signal 42, which may be indicative of the distortion within analog signal under test 18.

Figure 4:
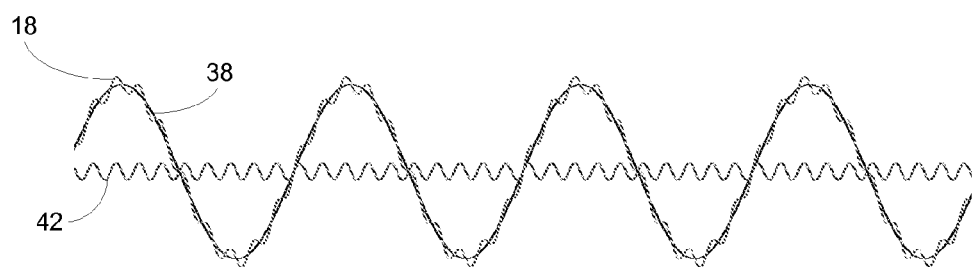

Referring also to FIG. 4 and continuing with the above-stated example, analog reference signal 38 (i.e., an essentially distortion-free sinusoid) may be essentially in phase with analog signal under test 18 (i.e., a sinusoid distorted by circuit under test 12). The distortion in analog signal under test 18 may be depicted as the deviation of analog signal under test 18 from analog reference signal 38.

Combining circuit 32 may include subtracting circuit 44. Subtracting circuit 44 may subtract 118 analog signal under test 18 from analog reference signal 38 to provide 116 analog residual signal 42, which is illustrated as the mathematical difference between analog signal under test 18 and analog reference signal 38. While analog residual signal 42 is shown having a relatively small amplitude, this is for illustrative purposes only and is not intended to be a limitation of this disclosure. Specifically, the amplitude of analog residual signal 42 may vary depending on the level of distortion present within analog signal under test 18 (i.e., the level of distortion introduced by circuit under test 12).

Figure 5:
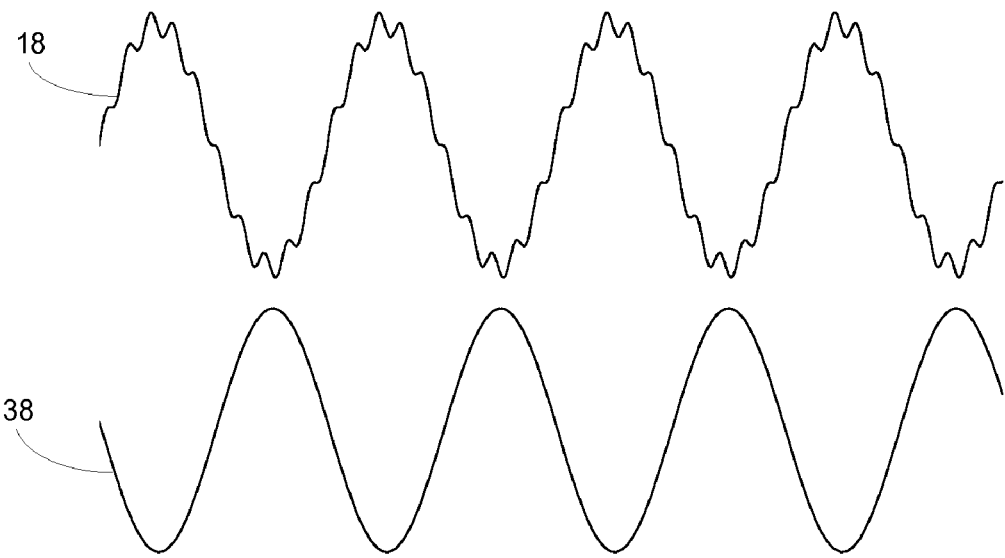
FIGS. 5-6 are diagrammatic representations of an analog signal under test, an "out-of-phase" analog reference signal, and an analog residual signal.
Figure 6:
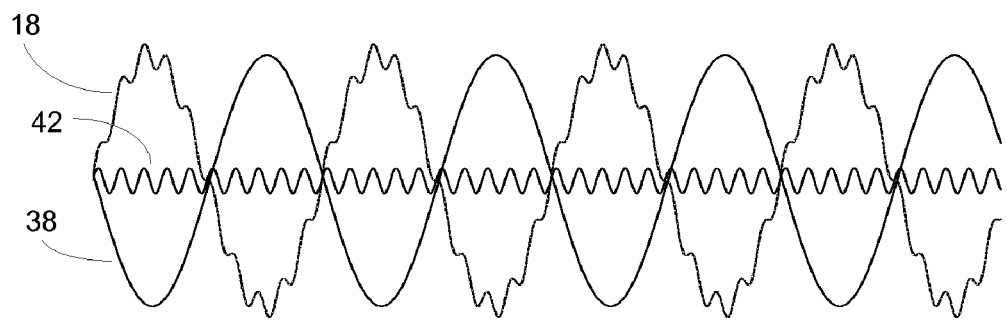

Referring also to FIGS. 5 & 6, depending on the manner in which signal generator 36 is configured, analog reference signal 38 may be essentially out of phase (i.e., shifted by 180°) with respect to analog signal under test 18. In such an embodiment, combining circuit 32 may include an summing circuit 46 that may add 120 analog reference signal 38 and analog signal under test 18 to provide 116 analog residual signal 42.

Automatic test system 10 may measure 122 one or more characteristics of analog residual signal 42. Automatic test system 10 may digitize analog residual signal 42 by e.g., providing 124 analog residual signal 42 to an analog-to-digital converter (e.g., analog-to-digital converter 28 included within sampling circuit 26). Once analog residual signal 42 is measured 122, various characteristics of analog residual signal 42 may be determined, such as the SINAD (i.e., signal-plus-noise-plus-distortion to noise-plus-distortion ratio) and total harmonic distortion (i.e., with respect to analog signal under test 18).

As analog residual signal 42 may be of comparatively small amplitude, analog residual signal 18 may be amplified 124 by amplifier 34 to generate amplified residual signal 48, which may be provided to analog-to-digital converter 28. The gain of amplifier 34 may be based upon the amplitude of analog residual signal 42, and the various characteristics of analog-to-digital converter 28, for example. For illustrative purposes, amplifier 34 may have a gain of approximately one-hundred. Data concerning residual signal 42, amplified residual signal 48 and/or the digitized residual signal (not shown) may be provided to third-party device 50 via output port/terminal 52. Examples of third-party device 50 may include but are not limited to a personal computer, a data collection device and/or a display panel, for example.

A number of implementations have been described. Nevertheless, it will be understood that various modifications may be made. Accordingly, other implementations are within the scope of the following claims.

What is claimed is:

1. A method of analyzing distortion comprising:
    determining, via a sampling circuit that receives an analog signal under test from a circuit under test, an amplitude and a relative phase of the analog signal under test;
    receiving the analog signal under test at a sampling circuit comprising an analog-to-digital converter to generate a digital signal under test based on the analog signal under test;
    generating an analog reference signal based, at least in part, upon the amplitude and the relative phase information contained in the digital signal under test received from the sampling circuit, the analog reference signal generated by a signal generator circuit comprising a digital to analog conversion circuit, wherein the signal generator is further configured to remove all or a portion of the distortion present within the digital signal under test;
    combining, via a combining circuit, the analog reference signal from the signal generator with the analog signal under test to generate a residual signal indicative of a distortion within the signal under test; and
    measuring the residual signal, wherein measuring the residual signal includes providing the residual signal to the analog-to-digital converter.

2. The method of claim 1 wherein generating the reference signal includes:
    receiving the digital signal under test;
    generating a digital reference signal based, at least in part, upon the digital signal under test; and
    providing the digital reference signal to a digital-to-analog converter to generate the analog reference signal.

3. The method of claim 1 wherein the reference signal is approximately in phase opposition with the signal under test, and wherein combining the reference signal with the signal under test includes:
    adding the reference signal and the signal under test.

4. The method of claim 1 wherein the reference signal is approximately in phase with the signal under test, and wherein combining the reference signal with the signal under test includes:
    subtracting the reference signal from the signal under test.

5. The method of claim 1 wherein providing the residual signal to an analog-to-digital converter includes:
    amplifying the residual signal.

6. A distortion analysis circuit comprising:
    a sampling circuit that receives an analog signal under test from a circuit under test and that determines an amplitude and a relative phase of the analog signal under test, wherein the sampling circuit further comprises an analog to digital converter, and wherein the sampling circuit generates and outputs a digital signal under test based on the analog signal under test;
    a signal generator including a digital to analog conversion circuit that provides an analog reference signal based, at least in part, upon amplitude and relative phase information contained in the digital signal under test received from the sampling circuit, wherein the signal generator removes all or a portion of the distortion present within the digital signal under test; and
    a combining circuit that combines the analog reference signal from the signal generator with the analog signal under test to generate a residual signal indicative of a distortion within the signal under test, wherein the residual signal is an analog residual signal; and
    the analog-to-digital converter further processes the analog residual signal received from the combining circuit and generates a digital residual signal.

7. The distortion analysis circuit according to claim 6 wherein the signal generator circuit includes a digital-to-analog converter, the signal generator circuit being configured to:
    receive the digital signal under test;
    generate a digital reference signal based, at least in part, upon the digital signal under test; and
    provide the digital reference signal to the digital-to-analog converter to generate the analog reference signal.

8. The distortion analysis circuit according to claim 6 wherein the reference signal is approximately in phase opposition with the signal under test and the combining circuit is configured to add the signal under test and the reference signal.

9. The distortion analysis circuit according to claim 6 wherein the reference signal is approximately in phase with the signal under test and the combining circuit is configured to subtract the reference signal from the signal under test.

10. The distortion analysis circuit according to claim 6 further comprising an amplifier circuit configured to amplify the residual signal.

11. An automatic test system comprising:
    an input port configured to receive an analog signal under test from a circuit under test to be analyzed; and
    a distortion analysis circuit including:
    a sampling circuit that receives the analog signal under test and determines an amplitude and a relative phase of the analog signal under test, wherein the sampling circuit further
    comprises an analog-to-digital converter configured to generate a digital signal under test based on the analog signal under test;
    a signal generator circuit including a digital to analog conversion circuit that provides an analog reference signal based, at least in part, upon amplitude and relative phase information contained in the digital signal under test received form the sampling circuit, wherein the signal generator further removes all or a portion of the distortion present within the digital signal under test; and
    a combining circuit that combines the analog reference signal from the signal generator with the analog signal under test to generate a residual signal indicative of a distortion within the signal under test, wherein the residual signal is an analog residual signal that is inputted to the analog-to-digital converter, which processes the analog residual signal and generates a digital residual signal.

12. The automatic test system according to claim 11 wherein the signal generator circuit includes a digital-to-analog converter, the signal generator circuit being configured to:
    receive the digital signal under test;
    generate a digital reference signal based, at least in part, upon the digital signal under test; and
    provide the digital reference signal to the digital-to-analog converter to generate the analog reference signal.

13. The automatic test system according to claim 11 wherein the reference signal is approximately in phase opposition with the signal under test and the combining circuit is configured to add the signal under test and the reference signal.

14. The automatic test system according to claim 11 wherein the reference signal is approximately in phase with the signal under test and the combining circuit is configured to subtract the reference signal from the signal under test.

15. The automatic test system according to claim 11 further comprising an amplifier circuit configured to amplify the residual signal.

* * * * *